United States Patent [19]

Alers et al.

[11] Patent Number: 6,002,113
[45] Date of Patent: Dec. 14, 1999

[54] APPARATUS FOR PROCESSING SILICON DEVICES WITH IMPROVED TEMPERATURE CONTROL

[75] Inventors: Glenn B. Alers, Santa Cruz, Calif.; Robert M. Fleming, Chatham, N.J.; Barry Franklin Levine, Livingston, N.J.; Gordon Albert Thomas, Princeton, N.J.

[73] Assignee: Lucent Technologies Inc., Murray Hill, N.J.

[21] Appl. No.: 09/080,430

[22] Filed: May 18, 1998

[51] Int. Cl.$^6$ .................................................. H05B 3/02
[52] U.S. Cl. ........................................ 219/483; 374/123
[58] Field of Search ........................... 219/502; 374/120, 374/121, 129, 130, 123; 356/43, 73

[56] References Cited

U.S. PATENT DOCUMENTS

| | | |
|---|---|---|
| 5,022,765 | 6/1991 | Guidoti et al. . |
| 5,098,199 | 3/1992 | Amith ..................................... 374/121 |
| 5,118,200 | 6/1992 | Kirillov et al. . |
| 5,154,512 | 10/1992 | Schietinger et al. . |
| 5,166,080 | 11/1992 | Schietinger et al. . |
| 5,258,602 | 11/1993 | Naselli et al. ........................... 219/497 |
| 5,310,260 | 5/1994 | Schietinger et al. . |
| 5,318,362 | 6/1994 | Schietinger et al. . |
| 5,325,181 | 6/1994 | Wilman . |
| 5,388,909 | 2/1995 | Johnson et al. . |
| 5,490,728 | 2/1996 | Schietinger et al. . |
| 5,568,978 | 10/1996 | Johnson et al. . |
| 5,669,979 | 9/1997 | Elliott et al. ................................. 134/1 |
| 5,686,674 | 11/1997 | Lowry et al. ........................... 73/865.8 |
| 5,703,342 | 12/1997 | Hoffmann et al. ...................... 219/497 |
| 5,825,478 | 10/1998 | Wilcox et al. ............................. 356/73 |

OTHER PUBLICATIONS

C. Schietinger, B. Adams, and C. Yarling, Mat. Res. Soc. Symp. Proc. 224,23 (1991).

B. Nguyenphu, M. Oh and A.T. Fiory, Mat. Res. Soc. Symp. Proc. 429, 291 (1996).

Minseok Oh, Et Al. Impact Of Emissivity–Independent Temperature Control In Rapid Thermal Processing,Mat. Res. Soc. Symp. Proc. vol. 470, 1997, pp. 43–48.

Philipp and Ehrenreich, Phys. Rev. vol. 129, p. 1550 (1963).

D. Peyton, H. Kinoshita, G.Q. Lo and D.L. Kwong, Proc. SPIE, 1393, 295 (1990).

T.P. Murray, Rev. Sci. Instrum. 38, 791, (1967).

G.P. Hansen, S. Krishnan, R.H. Hauge, and J.L. Margrave, Metall. Trans. A 19A, 39 (1988).

B. Peuse, A. Rosenkrans, and K. Snow, Proc SPIE 1804, 45 (1992).

T. Loarer, J.J. Greffet, and M. Huetz–Aubert, Appl. Opt. 29, 979 (1990).

D.W. Voorhes and D.M. Hall, Proc. SPIE 1595, 61 (1991).

D. Guidotti and J.G. Wilman, Appl. Phys. Lett. 60, 524 (1991).

D. Guidotti and J.G. Wilman, J. Van. Sci. Technol. A 10, 3184 (1992).

T. Sato, Jpn J. Appl. Phys. 6, 339 (1967).

*Primary Examiner*—Teresa Walberg
*Assistant Examiner*—Jeffrey Pwu
*Attorney, Agent, or Firm*—Mathews, Collins, Shepherd & Gould, P.A.

[57] ABSTRACT

Apparatus for processing a silicon workpiece uses reflected UV light to measure and control the workpiece temperature. A linearly polarized beam including UV light is directed onto a silicon surface to produce a reflected beam. The reflected beam is cross-polarized to null out much of the light, and the resulting residual reflectivity spectrum is determined. The temperature is determined from the characteristics of this spectrum. A workpiece heating station uses this measuring technique to accurately control the temperature of a silicon workpiece and temperature-dependent processing over a wide range of processing temperatures, including temperatures below 500° C.

9 Claims, 4 Drawing Sheets

APPARATUS FOR PROCESSING SILICON DEVICES WITH IMPROVED TEMPERATURE CONTROL

FIELD OF THE INVENTION

This invention relates to apparatus for processing silicon devices such as integrated circuits and, in particular, to such apparatus adapted for measuring silicon workpiece temperature and controlling temperature-dependent fabrication processes over a wide range including temperatures below 500° C.

BACKGROUND OF THE INVENTION

Many systems used in the fabrication of silicon devices are essentially systems for controlling the temperature of a silicon workpiece while some process is carried out. For example, dopants are deposited on or implanted in a masked silicon workpiece at prescribed temperatures and the workpiece is then heated to a prescribed higher temperature to provide a desired degree of diffusion or anneal. Similarly, layers of various additional materials such as oxides, nitrides and metals are deposited at prescribed temperatures and subjected to various heat treatments. Thus stations for carefully controlled heating of silicon workpieces are important parts of silicon device fabrication equipment.

A typical silicon workpiece heating station comprises a workpiece support, apparatus for measuring the temperature of the workpiece, and controllable heating elements, such as infrared bulbs, for heating the workpiece. Electronic circuitry receives the measured temperature and controls the heating elements to achieve the desired temperature as a function of time.

As silicon processing technology advances, the performance of conventional workpiece heating stations becomes less satisfactory. A major problem is presented by ongoing efforts to reduce the workpiece temperatures to below 500° C. in many processing steps.

Conventional heating stations use thermocouples or optical pyrometers to measure the temperature of the workpieces. While thermocouples are effective over a wide temperature range, they must attach to the workpiece for accuracy. Such attachment is costly, time-consuming and may contaminate the workpiece. Optical pyrometers need not be attached, but they have reduced accuracy at lower temperatures and lack the required accuracy at temperatures below 500° C.

Various efforts have been made to develop new temperature measuring devices for such applications. All have problems measuring and controlling workpiece temperature with the desired accuracy over the desired temperature range.

One such effort is to improve pyrometers by use of a ripple technique. This technique takes advantage of the thermal modulation of the AC current which powers the heating lamps. The pyrometer measures the oscillating component of light emitted from the workpiece. With this technique, the temperature of a workpiece can be controlled to an accuracy of 12° C. at temperatures near 1100° C., and pyrometers using the technique are effective to near 600° C. with decreasing accuracy. But lower operating temperatures and higher accuracy are required.

A second class of efforts is directed to measure semiconductor workpiece temperature by measuring variation in the reflectivity of the semiconductor near its optical bandgap energy. This band gap is the energy below which the semiconductor is substantially transparent. In some semiconductors, near the bandgap energy, the amount of reflected light changes rapidly with wavelength, and the energy gap shifts slightly as temperature changes. Thus it has been proposed to measure temperature by shining light of such wavelength on a semiconductor and measuring the reflectivity. This method works satisfactorily with direct bandgap semiconductors such a GaAs, but it does not work with silicon because silicon has an unusually weak texture in its reflectivity near its band gap. This is due to the fact that silicon is an indirect bandgap material.

A third group of efforts is to measure the temperature of a semiconductor by the change in the transmitted light near the optical band energy. While the technique will work for pure silicon, it does not work for silicon workpieces modified by the deposition of films on the workpiece surface because many of the materials normally deposited for integrated circuits are significantly absorbing or opaque. Thus, this approach is undesirably sensitive to deposited materials. Accordingly, there is a need for improved apparatus for measuring and controlling temperature of silicon workpieces during the fabrication of silicon devices.

SUMMARY OF THE INVENTION

In accordance with the invention, apparatus for processing a silicon workpiece uses reflected UV light to measure and control the workpiece temperature. A linearly polarized beam including UV light is directed onto a silicon surface to produce a reflected beam. The reflected beam is cross-polarized to null out much of the light, and the resulting residual reflectivity spectrum is determined. The temperature is determined from the characteristics of this spectrum. A workpiece heating station uses this measuring technique so accurately control the temperature of a silicon workpiece and temperature-dependent processing over a wide range of processing temperatures, including temperatures below 500° C.

BRIEF DESCRIPTION OF THE DRAWINGS

The advantages, nature and various additional features of the invention will appear more fully upon consideration of the illustrative embodiments now to be described in detail. In the drawings.

It is to be understood that these drawings are for purposes of illustrating the concepts of the invention and, except for the graphs, are not to scale.

DETAILED DESCRIPTION

Figure 1:
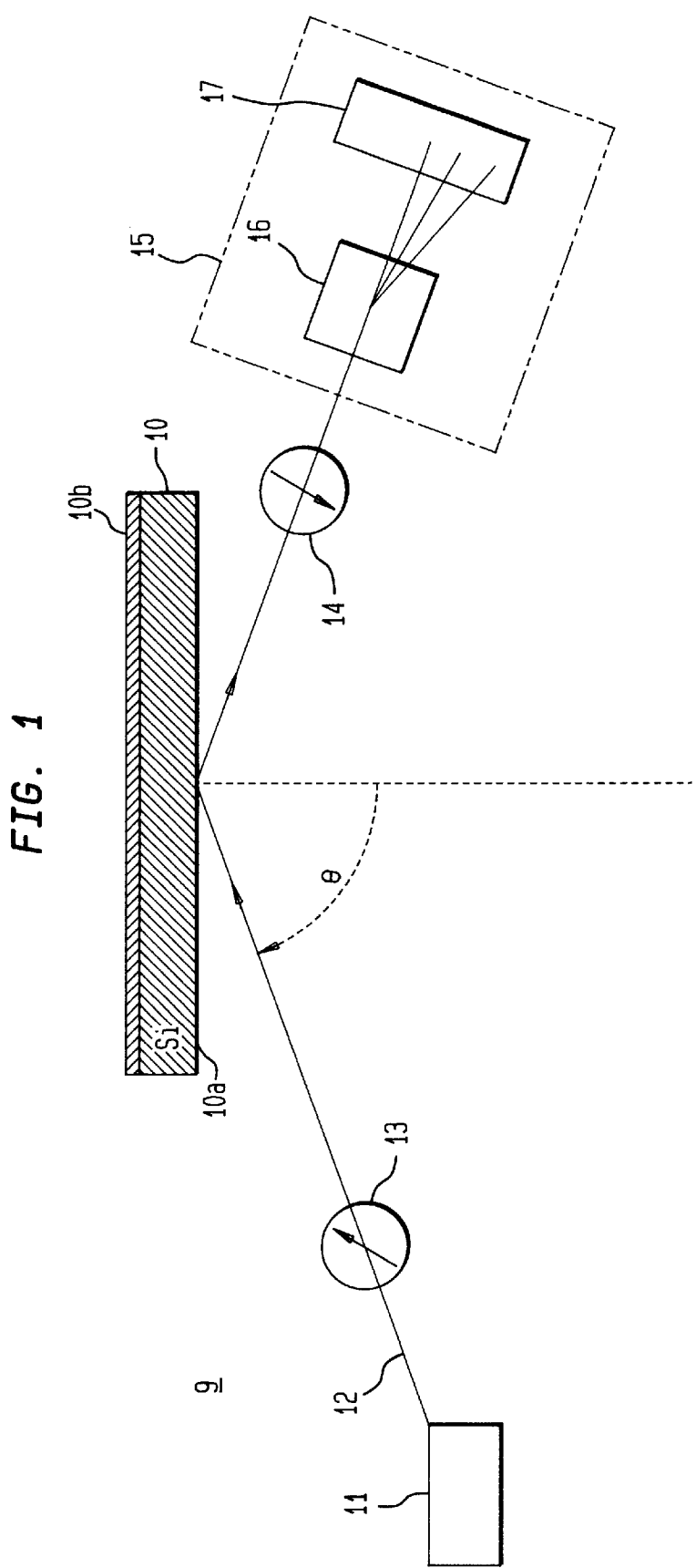
FIG. 1 is a schematic diagram of apparatus for measuring the temperature of a silicon workpiece.

Referring to the drawings, FIG. 1 is a schematic diagram of apparatus 9, for measuring the temperature of a silicon workpiece 10. The workpiece includes an exposed silicon surface 10A and may include an active surface 10B where microcircuits or other devices are to be formed or modified. The apparatus 9 comprises, in essence, a source 11 of a beam 12 of ultraviolet light directed through a polarizer 13 onto a silicon surface 10A of workpiece 10, advantageously at a relatively large angle of incidence θ (advantageously θ>45°). It further includes an arrangement for receiving the beam reflected from the silicon comprising a second polarizer 14 and spectrum analyzing apparatus 15 such as a dispersion element 16 and an array of photodetectors 17. In a preferred embodiment, the source 11 is preferably a deuterium lamp, which emits ultraviolet and visible light strongly in the range of wavelengths from 250 to 550 nm. The angle of incidence is preferably 45° to 80°. The polarizers 13, 14 are preferably linear polarizers, and the spectrum analyzer 15 can comprise an optical grating dispersion element 16 and an array of silicon photodetectors 17.

In operation, light in the wavelength range 250–550 nm is directed by a collimating lens (not shown) as a beam 12 through the polarizer 13 onto the silicon surface at an angle $\theta$ (most preferably $\theta$=70°) at which the reflected intensity from silicon is sensitive to polarization. The polarizer 13 preferably produces a beam that is linearly polarized with the electric field vector oriented so that it has substantial components both parallel and perpendicular to the silicon surface. A suitable polarization direction is 45° from the plane of incidence formed by the light beam 12 and a perpendicular to the silicon surface.

The reflected light beam is modified by the second polarizer 14, gathered by a lens (not shown) and spectrally analyzed. Specifically, the second polarizer is advantageously oriented as a cross polarizer compared to the first so as to null out (substantially reduce) polarized light over a wide range of wavelengths. This nulling out is possible because the reflectivity of silicon is nearly constant over this wavelength range. In contrast, at wavelengths shorter than about 450 nm, the silicon reflectivity varies substantially. The reflectivity of silicon in the UV range changes with temperature in a way that is intrinsic to silicon and is insensitive to impurities at typical concentration levels. This invention uses these changes to measure temperature.

Figure 2:
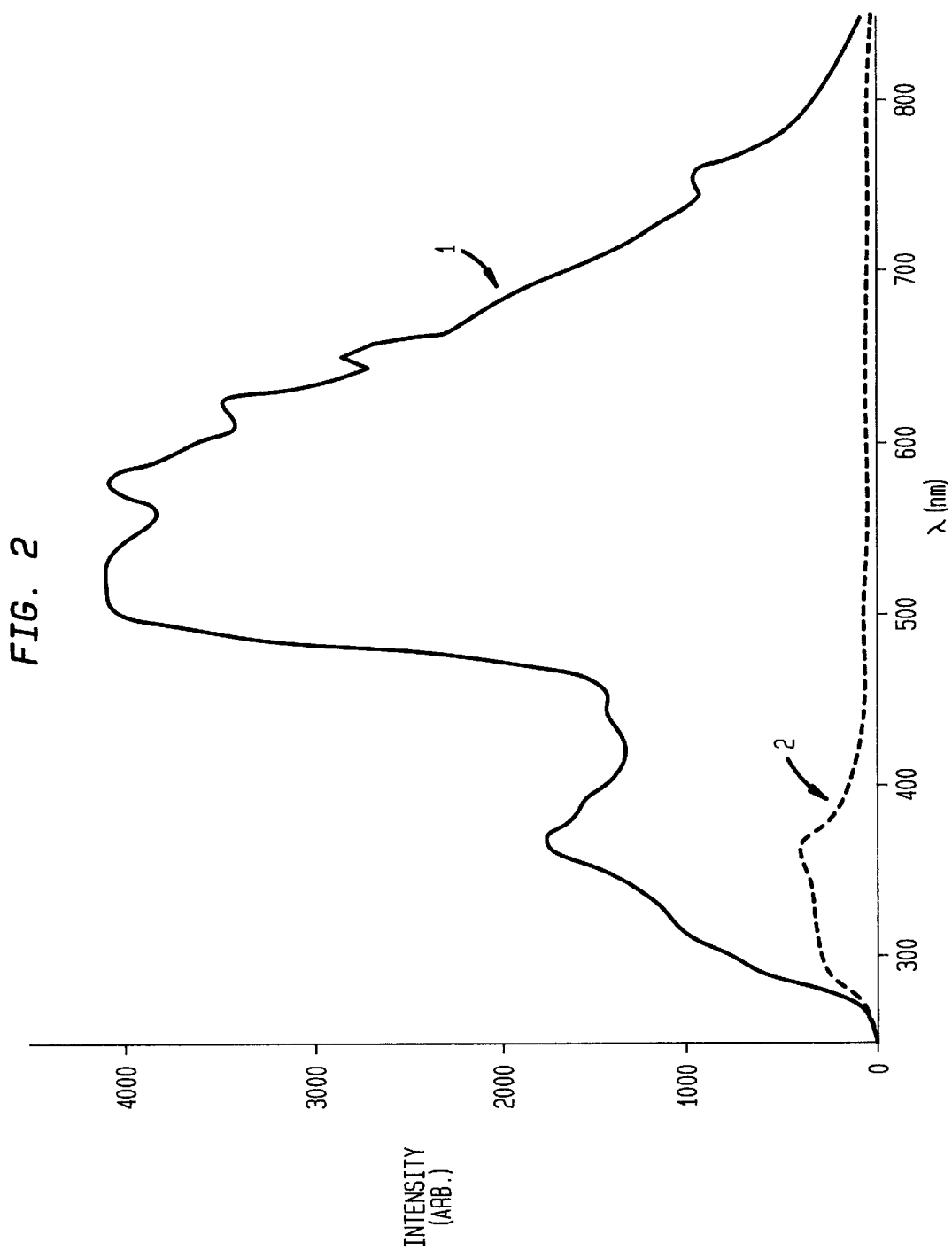
FIGS. 2 and 3 are spectra of polarized UV light reflected from a silicon wafer at different temperatures.

FIG. 2 is a graph showing intensity as a function of wavelength for polarized light reflecting off a silicon surface. Curve 1 (upper curve) shows the spectrum with the second polarizer 14 oriented far from "null". Curve 2 (lower curve) shows the intensity, with polarizer 14 rotated to the position for "null". As can be seen, the nulling polarizer essentially eliminates visible and IR (with wavelengths>450 nm) light, leaving some of the UV portion of the reflected intensity.

At each photodetector (17 of FIG. 1), the optical signal for a small range of wavelengths is converted to an electrical signal corresponding to the quantity of light in the range. A set of paired signals indicative of the intensities and the wavelengths at each of a plurality of different wavelength ranges is digitized and transmitted to a computer (not shown).

Figure 3:
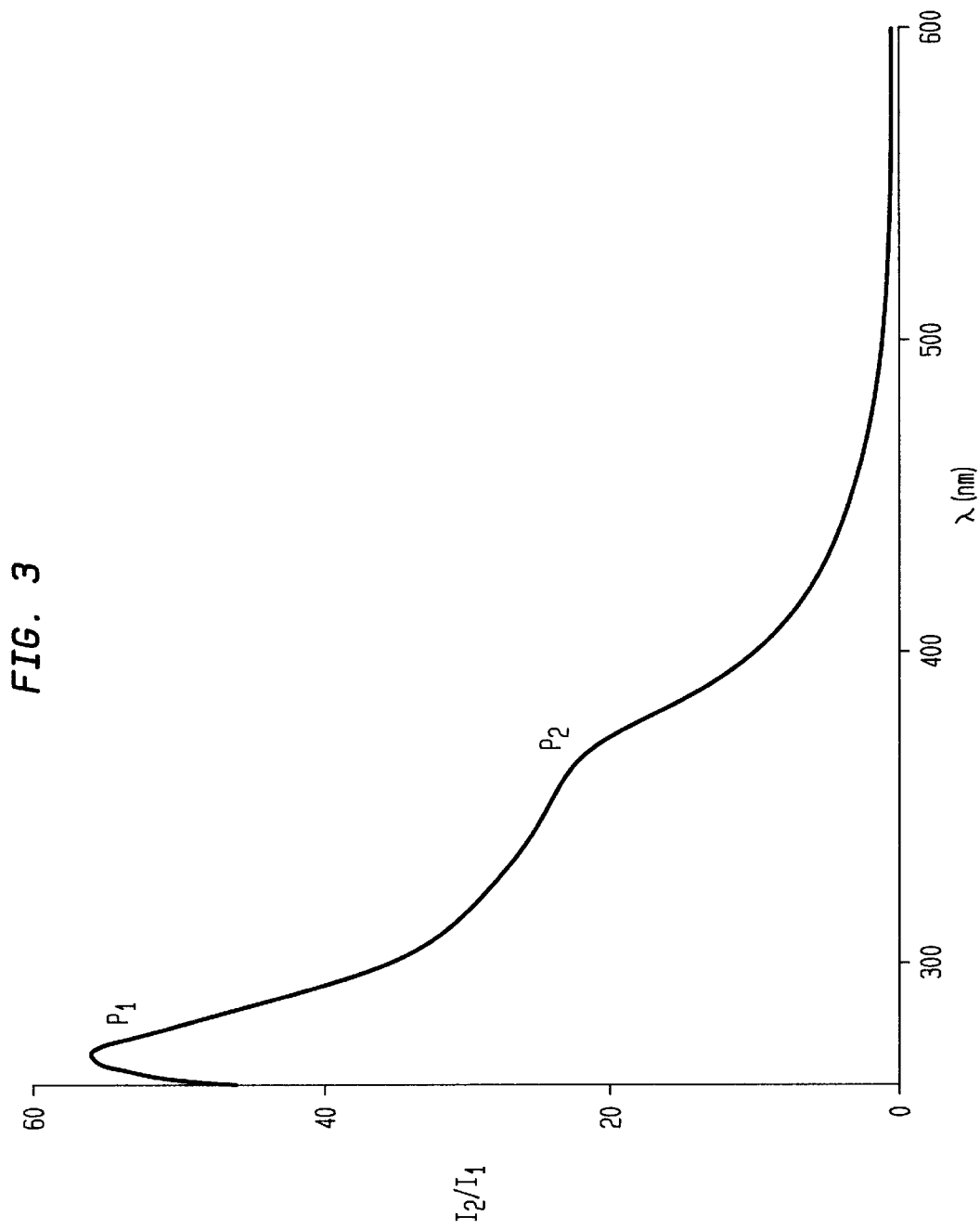

FIG. 3 is a plot of the residual reflectance formed by the ratio of the intensity curves shown in FIG. 2. At each UV wavelength, the intensity on curve 2 is divided (in a computer) by the reflected intensity on curve 1. As can be seen, the UV spectrum is characterized by two peaks, $P_1$ and $P_2$. These peaks are due to the silicon interband critical points $E'_0$ and $E_1$. The two peaks are characteristic of silicon, and they shift in position and in width with changes in temperature. The changes in this ratio spectrum are approximately 1% for each 10° C. change in temperature, providing a direct measure of the temperature change.

The computer analyzes the residual reflectance spectrum (e.g., FIG. 3) and converts the information to a value of temperature. The first step of the analysis of the wafer temperature is a calibration procedure in which the temperature of a test wafer is measured both with a thermocouple (or other suitable thermometer) attached to the wafer and also with the spectrum of reflected light as described above. The shape of the residual reflectance spectrum over a suitable wavelength range (e.g. 270 to 600 nm) is fitted with a set of reflectance functions and with reflectance variables characterizing these functions. For example, the shape can be fitted to Lorentzian functions using the non-linear least-squares method. Characterizing variables can include weight, width and peak wavelength of each function. This set of reflectance variables is then determined using the same reflectance, functions applied to residual reflectance spectra recorded at a series of temperatures (measured by the thermocouple). The resulting set of reflectance variables as a function of temperature is fitted similarly with temperatures functions (such as quadratic functions) and with temperature constants characterizing these temperature functions. The reflectance functions, temperature functions and temperature constants are then stored in the computer memory.

The second step in the analysis of the silicon wafer is the measurement procedure, in which the residual reflectance spectrum of a workpiece at an unknown temperature is measured. This measured spectrum plus the calibration data is used to determine the wafer temperature. The measured residual reflectance spectrum is fitted with the reflectance functions (the same functions used in the calibration) to determine the reflectance variables. These reflectance variables then serve as input for a calculation of the temperature using the temperature functions and the temperature constants (the same functions and constants as determined by the calibration procedure).

If it is desired to measure the temperature of a silicon wafer with a thin film coating, the calibration process is performed anew for that condition of the wafer and a new set of calibrations functions, variables and constants. The procedure for using the silicon reflectance to determine the wafer temperature requires that the optical beam "sees" the silicon, i.e. that any thin film coating on the silicon be substantially transparent in the wavelength range to be measured.

Figure 4:
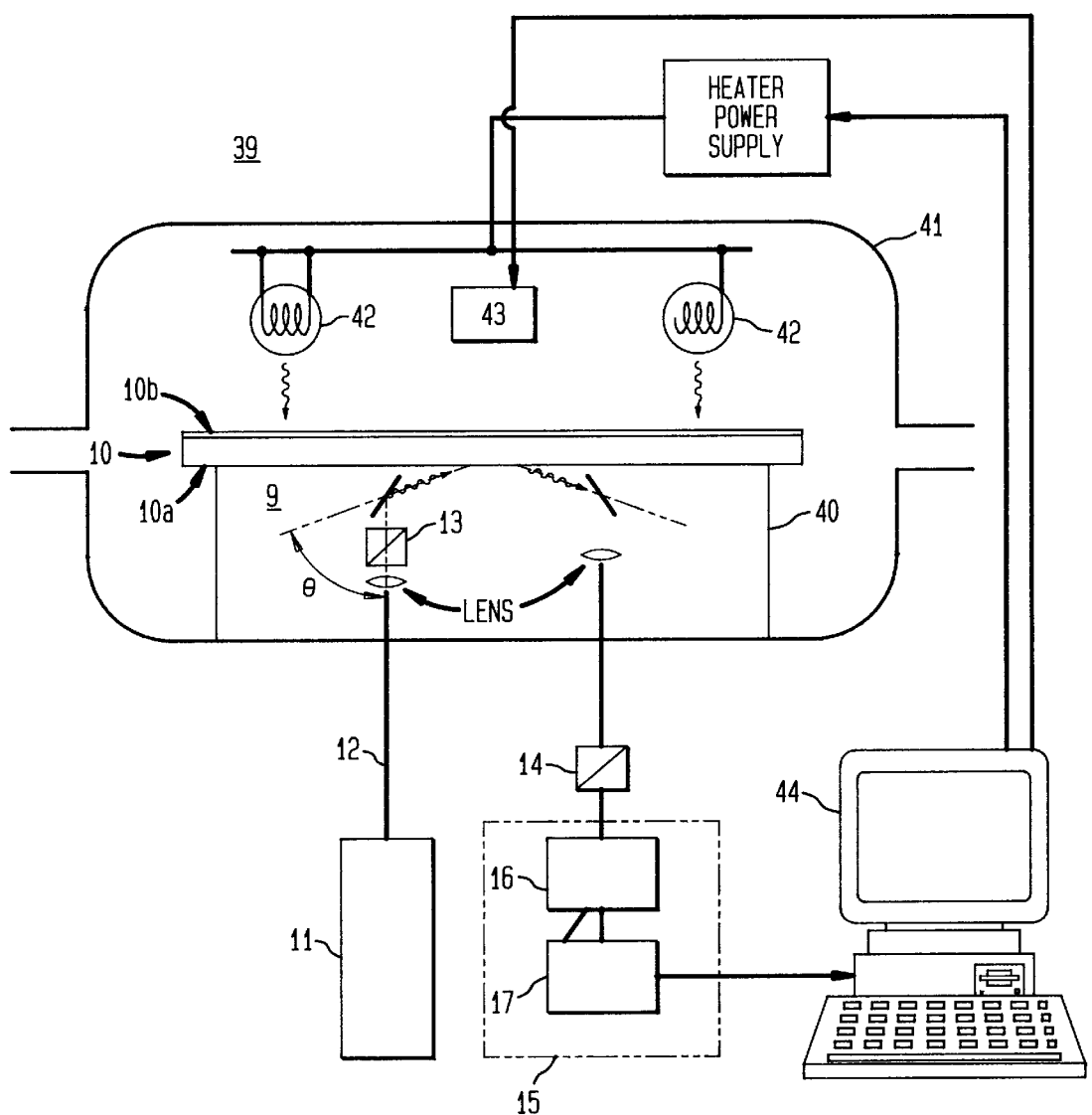
FIG. 4 is a schematic diagram of an improved silicon device fabrication apparatus.

FIG. 4 is a schematic diagram of an improved silicon workpiece processing apparatus 39 employing the apparatus of FIG. 1. Here the silicon workpiece 10 is disposed on a support 40 within chamber 41 for enclosing a controlled atmosphere, containing heating elements 42, such as lamps, for controllably heating the wafer. The chamber may also contain deposition apparatus 43 for depositing materials on the wafer. This can be CVD apparatus, sputtering apparatus or evaporation apparatus.

Also included within the chamber, on the opposite side of the wafer from the deposited films (underlying the wafer), is temperature measuring apparatus 9 comprising the source 11, polarizers 13, 14 and spectrum analyzer 15 of FIG. 1. During processing, apparatus 9 is used to measure the temperature of the wafer and provide temperature information to a computer 44 for controlling the heating elements 42. The computer can also use the temperature information to control temperature-dependent processing apparatus such as the deposition apparatus 43. The apparatus 9 operates as described in connection with FIG. 1. The advantage of the improved processing apparatus is that the temperature can be measured and controlled without contacting the wafer over a wide temperature range, including temperatures below 500° C., and even below room temperature.

It is to be understood that the above-described embodiments are illustrative of only a few of the may possible specific embodiments which can represent applications of the principles of the invention. Numerous and varied other arrangements can be made by those skilled in the art without departing from the spirit and scope of the invention.

What is claimed:

1. Apparatus for processing a silicon workpiece comprising:

a support for said workpiece;

an optical source for directing a beam of polarized light including ultraviolet light onto said workpiece;

a spectrum analyzer for receiving at least a portion of said beam reflected from said workpiece; and a computer for receiving from said spectrum analyzer information representative of the spectrum of said reflected beam and estimating therefrom the temperature of said workpiece.

2. Apparatus according to claim 1 further comprising one or more controllable heating elements for heating said workpiece and said computer, in response to said spectrum information, generates signals for controlling said heating elements.

3. Apparatus according to claim 1 further comprising controllable apparatus for depositing material on said workpiece and said computer, in response to said spectrum information, generates signals for controlling said apparatus for depositing material.

4. Apparatus according to claim 1 wherein said beam of polarized light is directed onto a silicon surface of said workpiece.

5. Apparatus according to claim 4 wherein said beam of polarized light is directed onto said silicon surface at an angle of incidence in the range 45° to 80°.

6. Apparatus according to claim 1 wherein said optical source comprises a deuterium lamp.

7. Apparatus according to claim 1 wherein said spectrum analyzer comprises an optical dispersion element and an array of photodetectors.

8. Apparatus according to claim 1 wherein said optical source comprises a first linear polarizer and further comprises a second linear polarizer in the path of light reflected from said workpiece, said second polarizer oriented for reducing polarized reflected light.

9. Apparatus according to claim 1 wherein said computer, in response to said spectrum information, generates signals for controlling a temperature-dependent silicon device fabrication process.

* * * * *